(12) United States Patent
Hsu (10) Patent No.: US 10,998,147 B2
(45) Date of Patent: May 4, 2021

(54) SWITCH DEVICE CAPABLE OF AUTOMATICALLY DETECTING AND ADJUSTING ZERO CROSS POINT

(71) Applicant: PROLIFIC TECHNOLOGY INC., Taipei (TW)

(72) Inventor: Chia-Chang Hsu, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 16/737,911

(22) Filed: Jan. 9, 2020

(65) Prior Publication Data

US 2020/0227216 A1   Jul. 16, 2020

(30) Foreign Application Priority Data

Jan. 11, 2019   (TW) .................................. 108101219

(51) Int. Cl.
| | |
|---|---|
| *H01H 9/56* | (2006.01) |
| *H01H 47/18* | (2006.01) |
| *G01R 31/327* | (2006.01) |
| *H01H 47/22* | (2006.01) |
| *H01H 47/32* | (2006.01) |

(52) U.S. Cl.
CPC ......... *H01H 9/563* (2013.01); *G01R 31/3278* (2013.01); *H01H 47/18* (2013.01); *H01H 47/223* (2013.01); *H01H 47/325* (2013.01)

(58) Field of Classification Search
CPC ......... H01H 47/001–002; H01H 47/18; H01H 47/325; H01H 47/223; H01H 2047/009; H01H 2300/03; H01H 2009/566; H01H 9/563; H01H 9/56; H01H 9/542; H01H 9/042; H03K 5/1536; H02H 3/22; H02H 3/24; H02J 9/061; G01R 31/3278; G01R 19/175; G01R 19/2509; G01R 19/2513; G01R 21/133
See application file for complete search history.

(56) References Cited

U.S. PATENT DOCUMENTS

2018/0317300 A1* 11/2018 Gross .................... H05B 47/10

* cited by examiner

*Primary Examiner* — Bryan R Perez (57) ABSTRACT

Disclosures of the present invention describe a switch device has a controlling and processing unit comprising a first zero point detector, a second zero point detector, an arc detector, and a microcontroller. According to zero crossing point of input voltage signal, zero crossing point of output voltage signal, relay's delay time, and arc-spark-induced signal, the microcontroller is capable of adaptively generating a relay controlling signal to control the relay, such that the relay achieves a short-circuit switching at the zero cross point of output voltage signal for making the output voltage signal be transmitted to at least one load device. Moreover, the microcontroller is also able to control the relay to finish a short-circuit switching at the zero cross point of input voltage signal, so as to stop the output voltage signal from being transmitted to the load device.

13 Claims, 12 Drawing Sheets

Switch state changing

SWITCH DEVICE CAPABLE OF AUTOMATICALLY DETECTING AND ADJUSTING ZERO CROSS POINT

BACKGROUND OF THE INVENTION

1. Field of the Invention

The present invention relates to the technology field of electrical switches, and more particularly to a switch device capable of automatically detecting and adjusting zero crossing point.

2. Description of the Prior Art

Relay is an electrical switch comprising an input loop and at least one output loop. In operation, relay utilize a low level control signal to switch a much higher voltage or current supply using a number of different contact arrangements, and can be controlled by a single processor unit so as to achieve protections to a circuit and/or electronic components thereof by switching current loop. Therefore, relay has been widely applied in various electrical devices or apparatuses.

Figure 1:
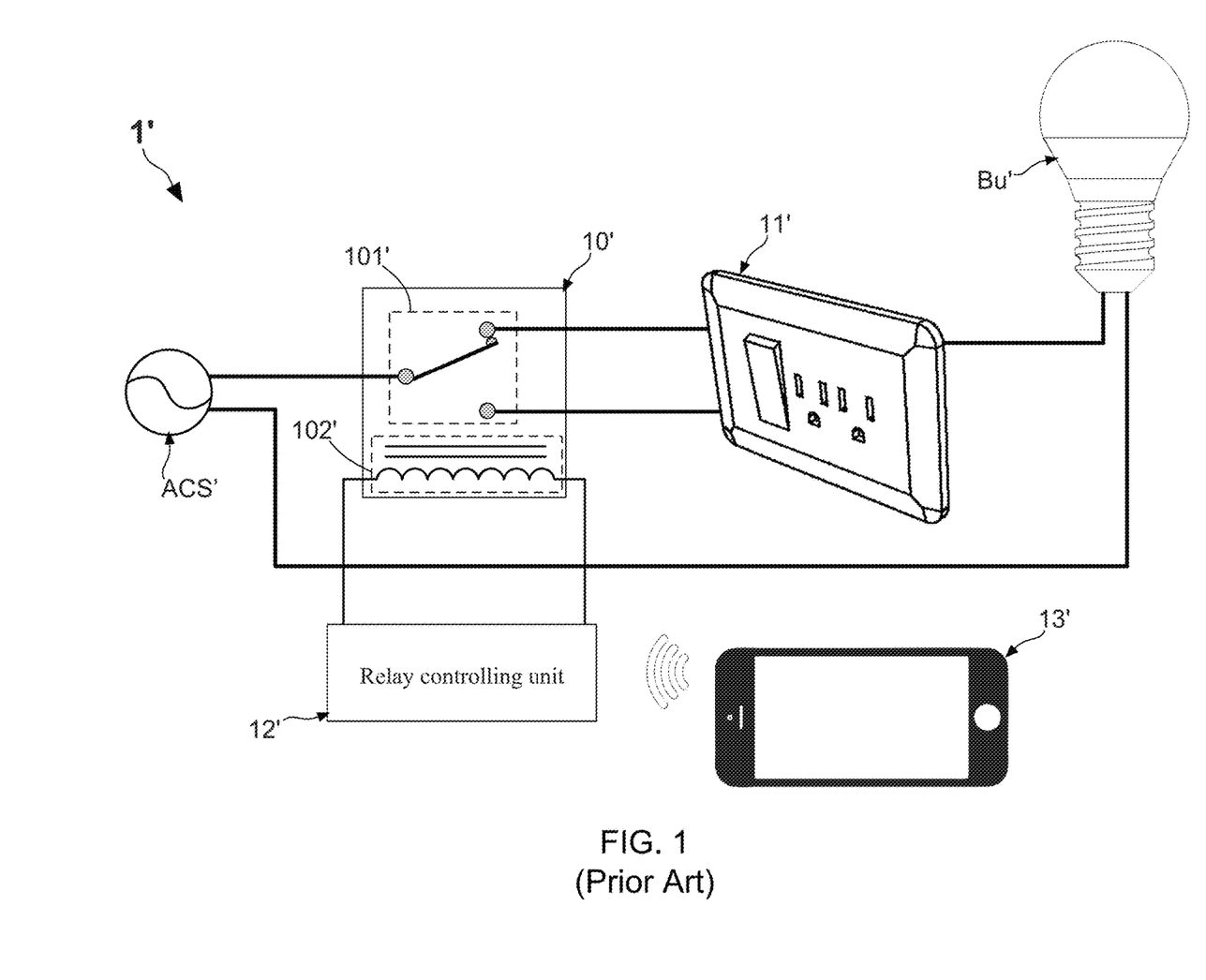
FIG. 1 shows a framework diagram of a digital home illumination system.

Nowadays, relay has become a necessary electrical unit for use in digital home appliance system. FIG. 1 shows a framework diagram of a digital home illumination system 1', comprising: a relay 10', a switch device 11', a relay controlling unit 12', and a portable electronic device 13'. As FIG. 1 shows, the relay 10' comprises a 3-way switch 101' and a solenoid 102', and the 3-way switch 101' electrically connected between a live wire terminal (L terminal) of an AC power source ACS' and the switch device 11'. On the other hand, the solenoid 102' is electrically connected to the relay controlling unit 12'. By such arrangement, a user is able to operate his portable electronic device 13' like a smart phone so as to activate the relay controlling unit 12' transmit a switch controlling current o the solenoid 102'. As a result, a switch state of the 3-way switch 101' is changed by a magnetic force generated by the solenoid 102', such that a lighting device Bu' is therefore turned on or off.

The relay 10' shown in FIG. 1 is constructed with electrical, mechanical and magnetic components, and have operating coil and mechanical contacts. After the switch controlling current is transmitted to the solenoid 102', it needs to spend around 10-120 seconds starting from the mechanical contacts being affected by the magnetic force to the switch state of the 3-way switch 101' being achieved. Therefore, it is understood that, action time point of the mechanical contacts in the relay 10' might be at a high-level voltage time point or a low-level voltage time point of the AC power source ACS' while there is no proper switching control provided by the relay controlling unit 12'. In this case, sparking might occur by instant engagement between the mechanical contacts in the relay 10', and that would cause the useful life of the relay 10' or the lighting device Bu' (i.e., load device) be reduced.

Figure 2:
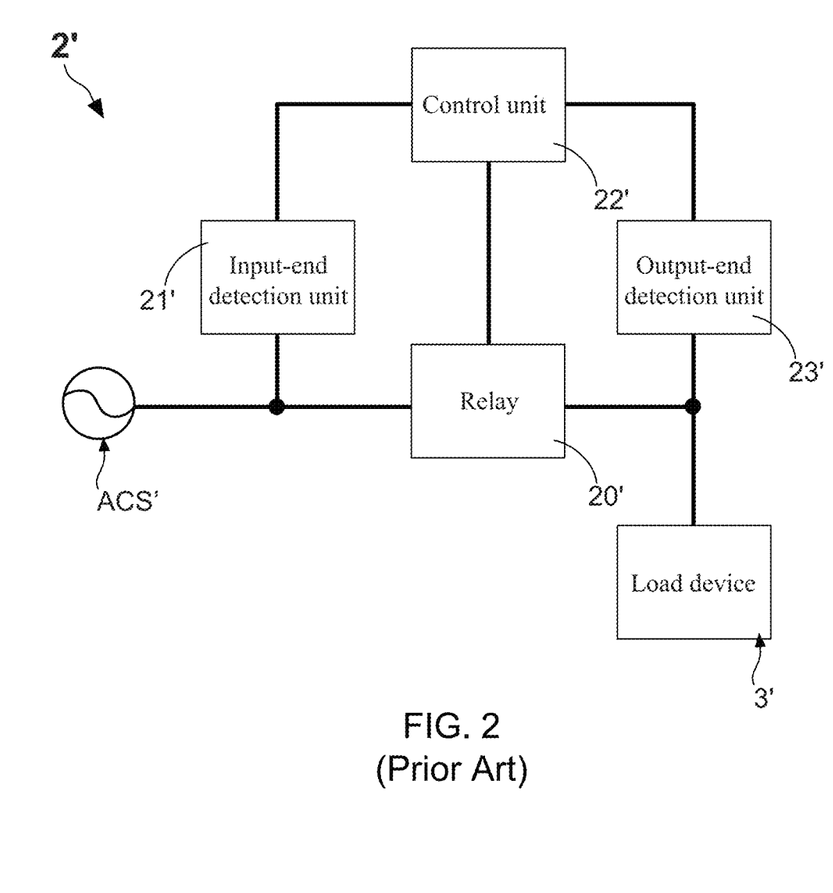
FIG. 2 shows a function block diagram of a delay time compensated relay system disclosed by Taiwan patent No. 1423293.

Accordingly, Taiwan patent No. 1423293 discloses a delay time compensated relay system. FIG. 2 shows a function block diagram of the delay time compensated relay system. The delay time compensated relay system 2' comprises a relay 20', an input-end detection unit 21', a control unit 22', and an output-end detection unit 23'. As FIG. 2 shows, the relay 20' is electrically connected between an AC power source ACS' and a load device 3', the input-end detection unit 21' is electrically connected between the AC power source ACS' and the relay 20', and the output-end detection unit 23' is electrically connected between the relay 20' and the load device 3'. On the other hand, the control unit 22' electrically connected to the input-end detection unit 21', the relay 20' and the output-end detection unit 23', simultaneously. Particularly, the input-end detection unit 21' is configured to detect an electrical potential timing of an input AC signal received by the relay 20', and the output-end detection unit 23' is adopted for detecting an electrical potential timing of an output AC signal of the relay 20'. After receiving the electrical potential timing of the input AC signal and the electrical potential timing of the output AC signal, the control unit 22' is able to calculate a delay time compositing parameter, so as to correspondingly generate a relay controlling signal to activate the relay 20' change its switch state at a zero crossing point of an AC signal supplied by the AC power source ACS'.

Figure 3:
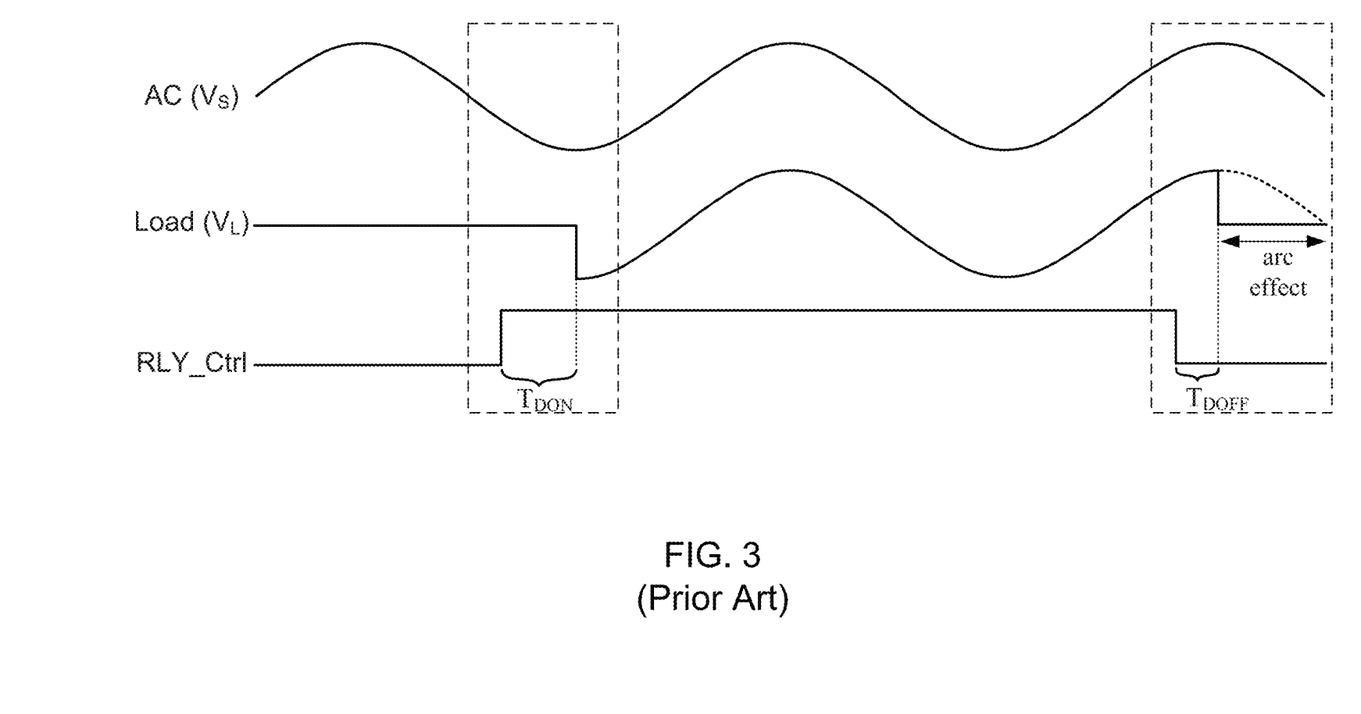
FIG. 3 shows a signal waveform diagram for describing three signals.

FIG. 3 shows a signal waveform diagram for describing three signals. In FIG. 3, RTY_Ctrl is the relay controlling signal generated by the control unit 22', AC(Vs) is the detected input AC signal transmitted from the input-end detection unit 21', and Load ($V_L$) is the detected output AC signal transmitted from the output-end detection unit 23'. Moreover, $T_{DON}$ is a delay time of the relay 20' when the relay 20' executes a short-circuit switch. On the contrary, $T_{DOFF}$ is a delay time of the relay 20' when the relay 20' executes an open-circuit switch. In an ideal case, control unit 22' produces the relay controlling signal RTY_Ctrl based on the detected output AC signal Load ($V_L$), the detected input AC signal AC(Vs) and the relay's delay time. Please refer to a left segment surrounded by one dotted box, which shows that the control unit 22' utilizes the relay controlling signal to activate the relay 20' execute the short-circuit switch at a zero crossing point of the output AC signal, so as to make a load connecting terminal of the relay 20' be connected to the load device 3'. On the other hand, a right portion surrounded by another one dotted box indicates that the control unit 22' uses the relay controlling signal to activate the relay 20' execute the open-circuit switch at a zero crossing point of the input AC signal, such that the output AC signal is stopped from being transmitted to the load device 3'.

Figure 4:
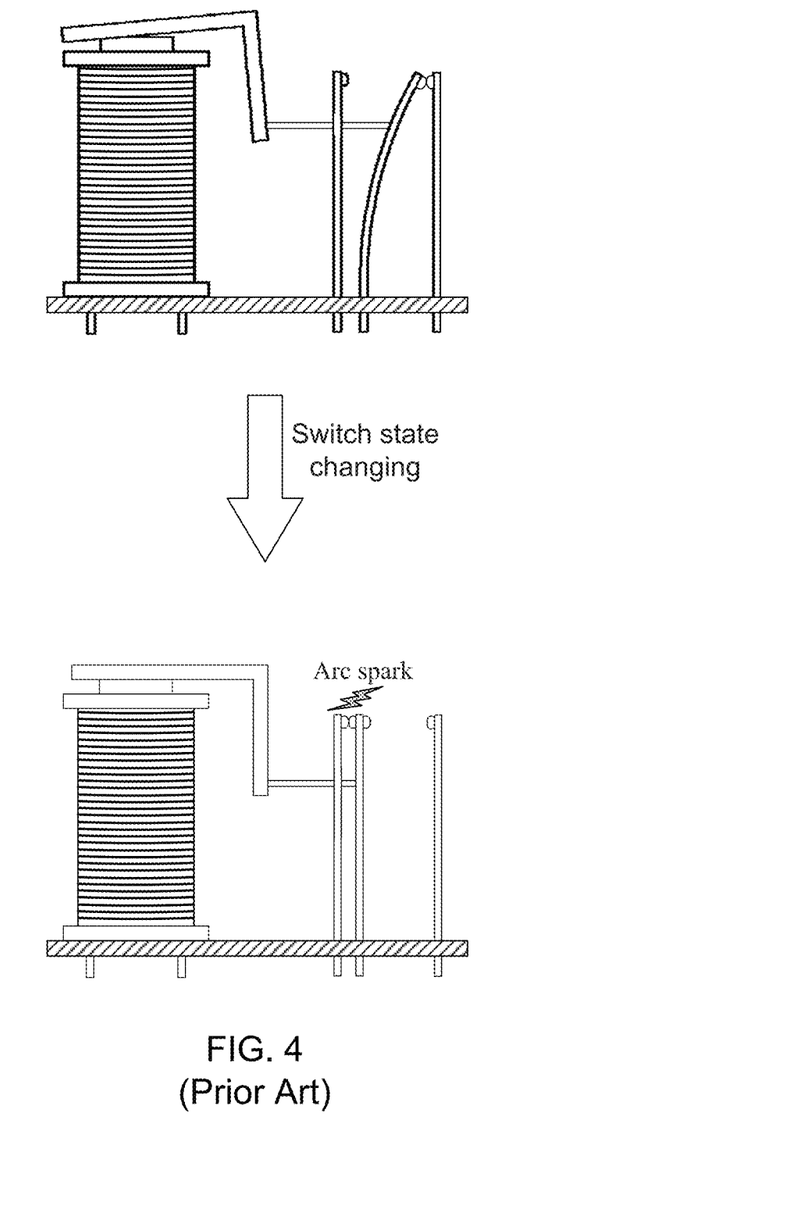
FIG. 4 shows a diagram for describing switch state changing of a relay.

Referring to FIG. 3 again, and please simultaneously refer to FIG. 4, which shows a diagram for describing the switch state changing of the relay. In the case of there being any load device 3' electrically connected to the relay 20', the relay 20' can be controlled by the control unit 22' so as to execute the open-circuit switch at the zero crossing point of the input AC signal. However, after the relay 20' is electrically connected to the load device 3', an arc spark would occur at the timing of the relay 20' executing the open-circuit switch, and the arc spark would cause the output AC signal be continuously transmitted to the load device 3' even though the open-circuit switch is completed. From above descriptions, it is understood that, despite the delay time compensated relay system 2' disclosed by Taiwan patent No. 1423293 indeed can control the relay 20' change its switch state at the zero crossing point of the input AC signal or the output AC signal, the delay time compensated relay system 2' still fails to eliminate the adverse effects caused by the arc spark.

From above descriptions, it is clear that there is a room for improvement in the conventional delay time compensated relay system 2'. In view of that, inventors of the present application have made great efforts to make inventive research and eventually provided a switch device capable of automatically detecting and adjusting zero crossing point.

SUMMARY OF THE INVENTION

The primary objective of the present invention is to provide a switch device capable of automatically detecting and adjusting zero crossing point, having a controlling and processing unit comprising a first zero point detector, a second zero point detector, an arc detector, and a microcontroller. According to zero crossing point of an input voltage signal, zero crossing point of an output voltage signal, relay's delay time, and an arc-spark-induced signal detected by the arc detector, the microcontroller is capable of adaptively generating a relay controlling signal to control the relay, such that the relay achieves a short-circuit switching at the zero cross point of output voltage signal for making the output voltage signal be transmitted to at least one load device. Moreover, the microcontroller is also able to control the relay to finish a short-circuit switching at the zero cross point of input voltage signal, so as to stop the output voltage signal from being transmitted to the load device.

In order to achieve the primary objective of the present invention, the inventor of the present invention provides an embodiment for the switch device capable of automatically detecting and adjusting zero crossing point, comprising:

an input voltage detecting unit, being coupled to an AC power source for detecting an input voltage signal supplied by the AC power source;

an output voltage detecting unit, being electrically connected to a load connecting terminal of a relay, so as to detect an output voltage signal from the load connecting terminal; wherein an input terminal of the relay is coupled to the AC power source; and a controlling and processing unit, being electrically connected to the input voltage detecting unit, the output voltage detecting unit, and the relay, and comprising:

a first detector, being configured for detecting a zero crossing point of the input voltage signal;

a second detector, being configured for detecting a zero crossing point of the output voltage signal;

an arc detector, being configured for detecting an arc-spark-induced signal from the output voltage signal; and a microcontroller, being coupled to the first detector, the second detector and the arc detector;

wherein the microcontroller generates a first relay controlling signal based on the zero crossing point of the input voltage signal, the zero crossing point of the output voltage signal, the arc-spark-induced signal, and at least one delay time of the relay, and utilizing the first relay controlling signal to control the relay to achieve a short-circuit switch at the zero crossing point of the output voltage signal or an open-circuit switch at the zero crossing point of the input voltage signal.

The embodiment of the switch device further comprises:

an input current detecting unit, being coupled to the AC power source and electrically connected to the microcontroller, and being configured for detecting an input current signal supplied by the AC power source, so as to transmit the detected input current signal to the microcontroller.

In the embodiment of the switch device, wherein the controlling and processing unit further comprises:

a third detector, being coupled to the microcontroller, and being configured for detecting a zero crossing point of the input current signal;

wherein the microcontroller generates a second relay controlling signal based on the zero crossing point of the input voltage signal, the zero crossing point of the output voltage signal, the arc-spark-induced signal, the at least one delay time of the relay, and the zero crossing point of the input current signal, and utilizing the second relay controlling signal to control the relay to achieve the short-circuit switch at the zero crossing point of the output voltage signal or an open-circuit switch at the zero crossing point of the input current signal.

In the embodiment of the switch device, wherein load device is a home appliance and the switch device is integrated in a wall switch.

In the embodiment of the switch device, wherein the controlling and processing unit further comprises:

a first analog-to-digital convertor, being electrically connected between the input voltage detecting unit and the first detector, and being configured for converting the input voltage signal to a digital input voltage signal;

a second analog-to-digital convertor, being electrically connected between the output voltage detecting unit and the second detector, and being configured for converting the output voltage signal to a digital output voltage signal; and a third analog-to-digital convertor, being electrically connected between the input current detecting unit and the third detector, and being configured for converting the input current signal to a digital input current signal.

In the embodiment of the switch device, wherein the controlling and processing unit further comprises:

a low voltage detector, being electrically connected to the input voltage detecting unit for applying a low voltage detecting process to the input voltage signal;

an over voltage detector, being electrically connected to the output voltage detecting unit for applying an over voltage detecting process to the output voltage signal;

an over current detector, being electrically connected to the input current detecting unit for applying an over current detecting process to the input current signal; and an over power detector, being electrically connected to the input current detecting unit and the output voltage detecting unit for applying an over power detecting process to the input current signal and the output voltage signal.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a switch device capable of automatically detecting and adjusting zero crossing point disclosed by the present invention, embodiments of the present invention will be described in detail with reference to the attached drawings hereinafter.

First Embodiment

Figure 5:
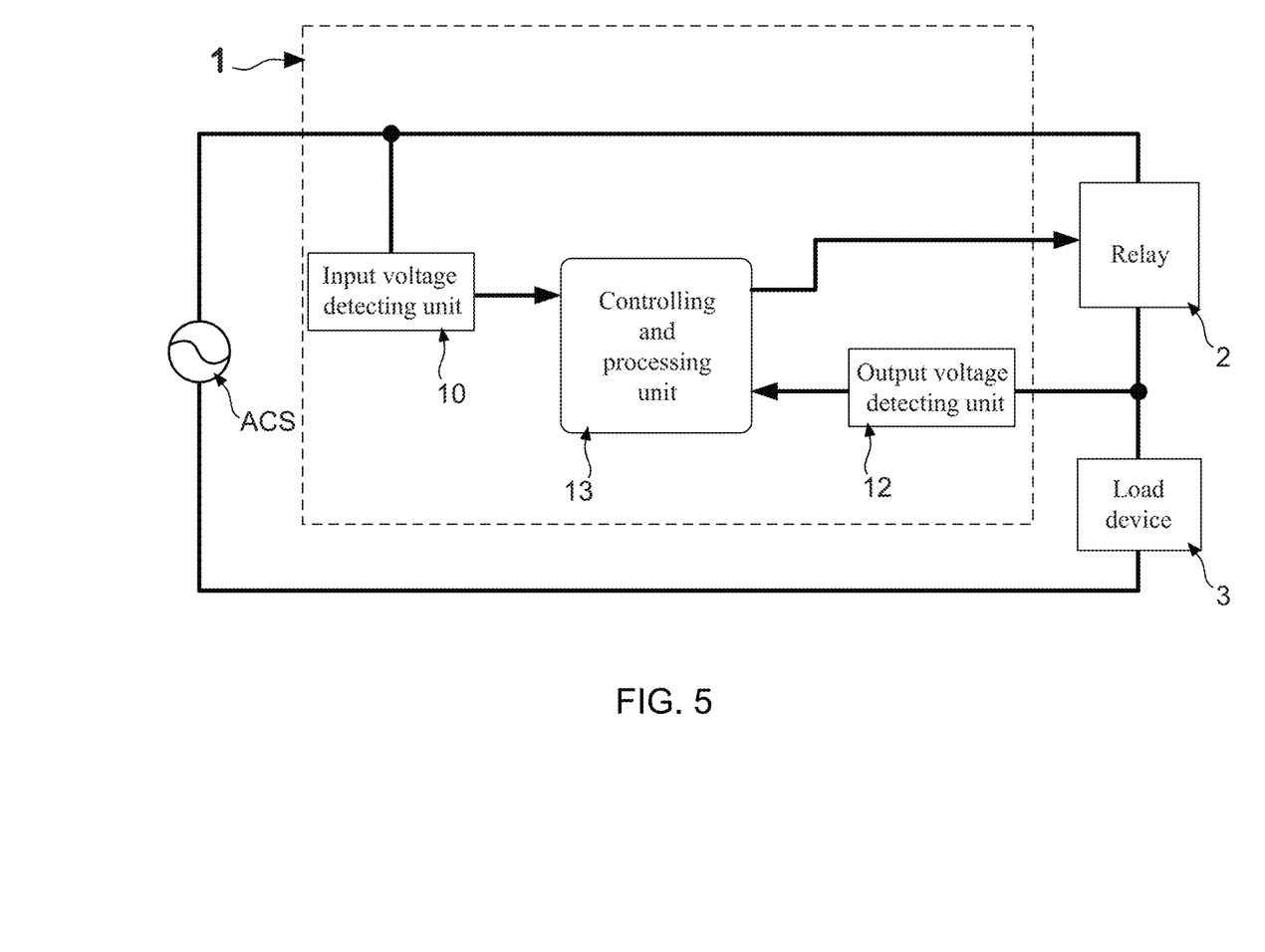
FIG. 5 shows a first function block diagram of a first embodiment of a switch device capable of automatically detecting and adjusting zero crossing point according to the present invention.

With reference to FIG. 5, there is provided a first function block diagram of a first embodiment of a switch device capable of automatically detecting and adjusting zero crossing point according to the present invention. As FIG. 5 shows, the switch device 1 of the present invention mainly comprises an input voltage detecting unit 10, an output voltage detecting unit 12 and a controlling and processing unit 13. The input voltage detecting unit 10 is coupled to an AC power source ACS for detecting an input voltage signal supplied by the AC power source ACS. On the other hand, the output voltage detecting unit 12 is electrically connected to a load connecting terminal of a relay 2, so as to detect an output voltage signal from the load connecting terminal. Herein, it needs to further explain that an input terminal of the relay 2 is coupled to the AC power source ACS. In a specific case, both the input voltage detecting unit 10 and the output voltage detecting unit 12 are a resistive voltage divider. However, that does not mean the resistive voltage divider is a particularly-limited embodiment of the input voltage detecting unit 10 and the output voltage detecting unit 12. Of course, both the input voltage detecting unit 10 and the output voltage detecting unit 12 can also be a Hall effect sensor, a potential transformer (PT), or an electro-optic voltage transformer when practically implementing the switch device 1 of the present invention.

Figure 6:
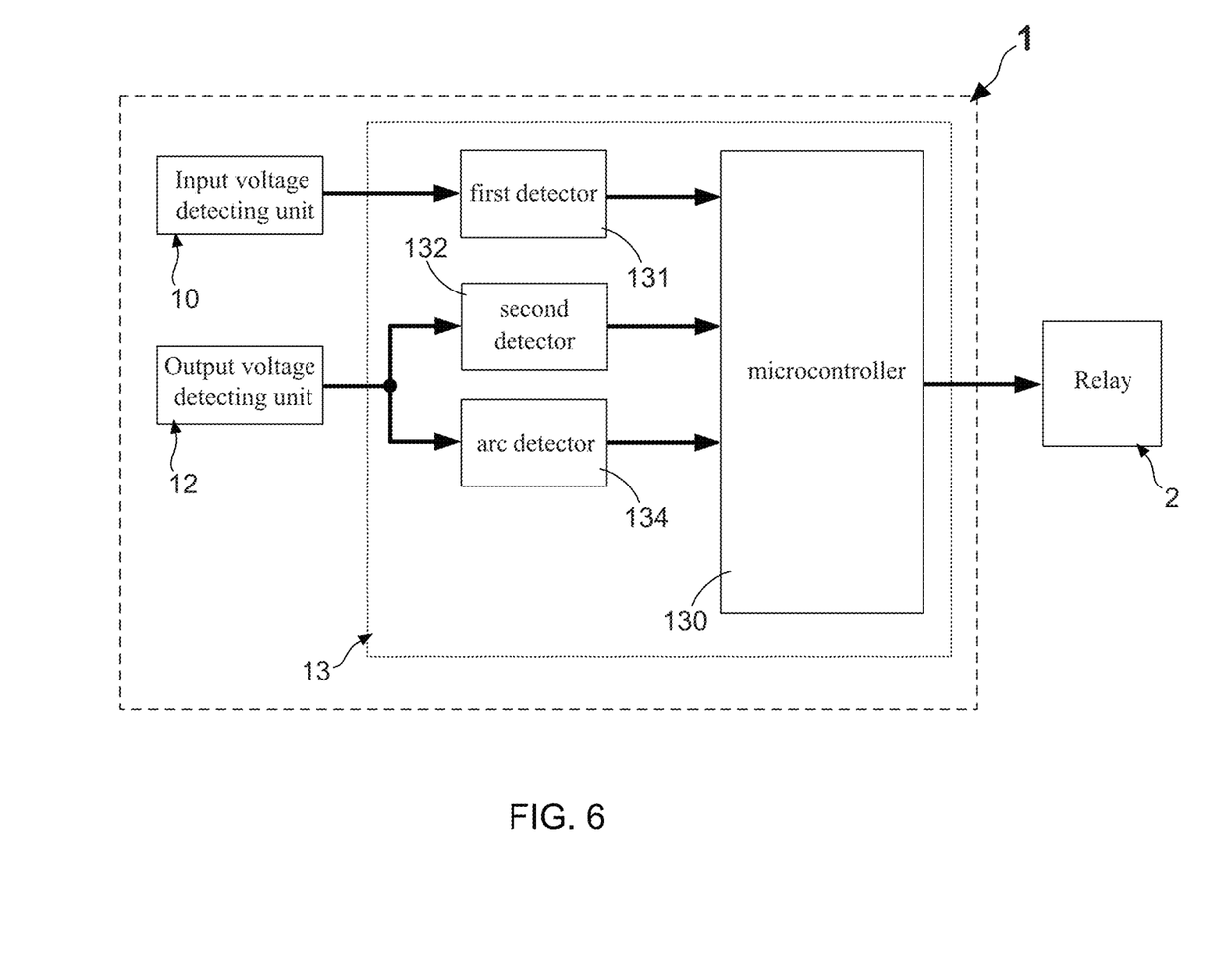
FIG. 6 shows a first inner function block diagram of a controlling and processing unit of the switch device.

Referring to FIG. 5 again, and please simultaneously refer to FIG. 6, which illustrates a first inner function block diagram of the controlling and processing unit of the switch device. From FIG. 6, it is found that a first detector 131, a second detector 132, an arc detector 133, and a microcontroller 130 are provided in the controlling and processing unit 13. According the particular design of the present invention, the first detector 131 is configured for detecting a zero crossing point of the input voltage signal, the second detector 132 is configured for detecting a zero crossing point of the output voltage signal, and the arc detector 133 is configured for detecting an arc-spark-induced signal from the output voltage signal. On the other hand, the microcontroller 130 is coupled to the first detector 131, the second detector 132 and the arc detector 133.

By such arrangement, the microcontroller 130 generates a relay controlling signal based on the zero crossing point of the input voltage signal, the zero crossing point of the output voltage signal, the arc-spark-induced signal, and at least one delay time of the relay 2, so as to control the relay 2 execute a short-circuit switch at the zero crossing point of the output voltage signal through the relay controlling signal. Therefore, the load connecting terminal of the relay 2 is electrically connected to at least one load device 3, such that the output voltage signal is transmitted to the load device 3. In addition, the microcontroller 130 also utilizes the relay controlling signal to control the relay 2 to achieve an open-circuit switch at the zero crossing point of the input voltage signal, so as to stop the output voltage signal from being transmitted to the load device 3.

Figure 7:
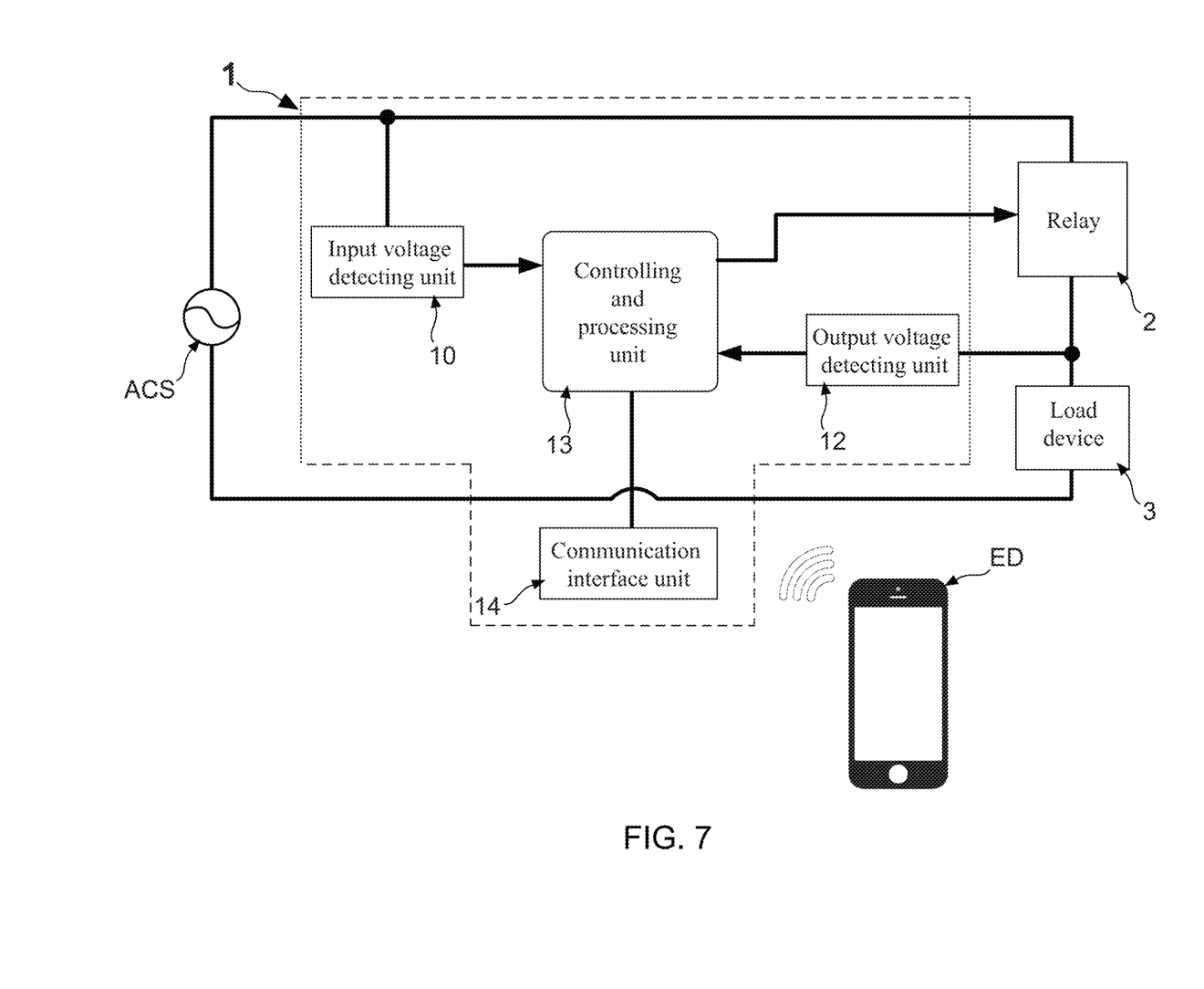
FIG. 7 shows a second function block diagram of the first embodiment of the switch device.
Figure 8:
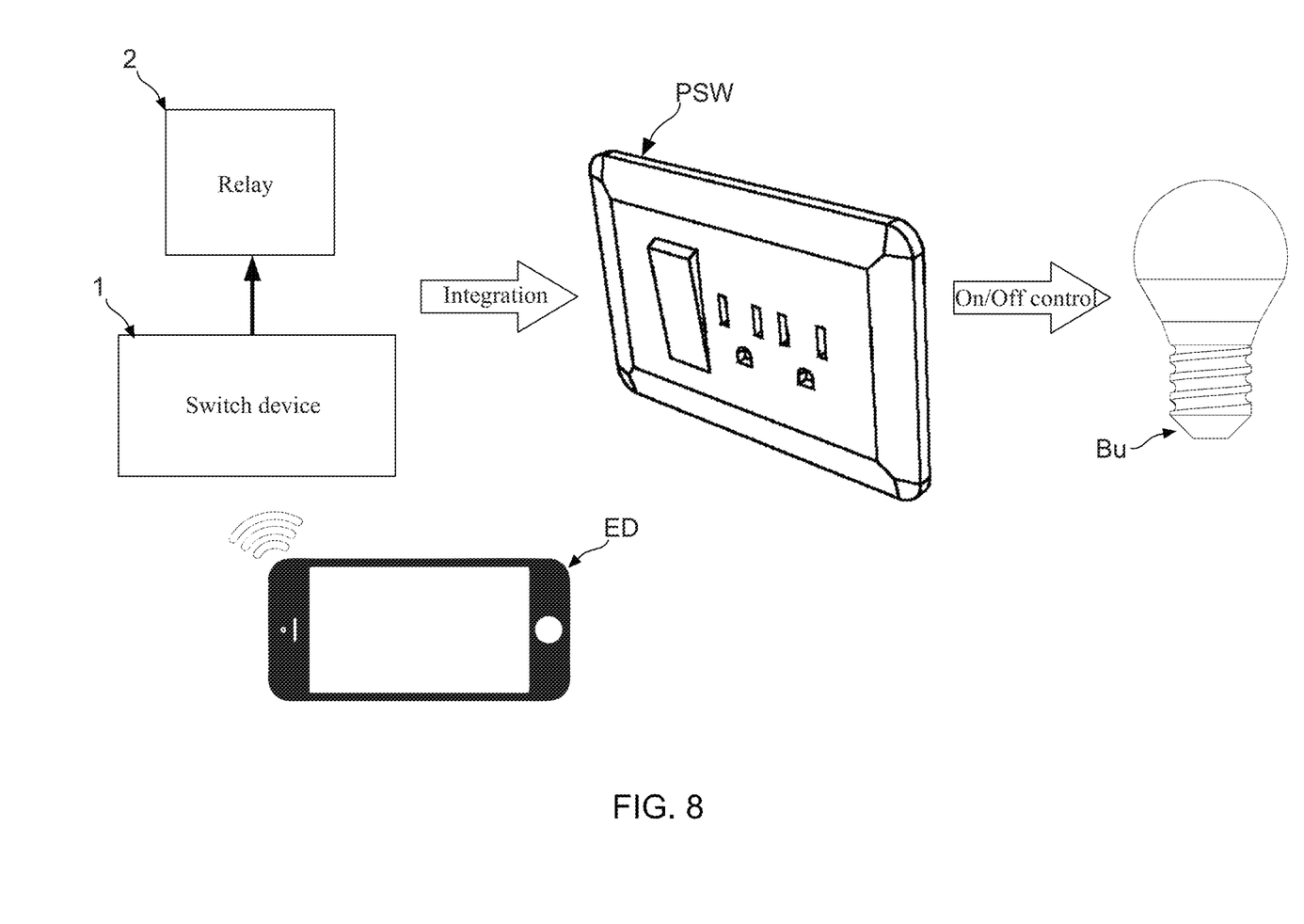
FIG. 8 shows a diagram for describing a piratical application of the switch device.

FIG. 7 shows a second function block diagram of the first embodiment of the switch device, and FIG. 8 depicts a diagram for describing a piratical application of the switch device. In FIG. 7, the switch device 1 of the present invention further comprises a communication interface unit 14, which is electrically connected to the microcontroller 130 for making the microcontroller 130 communicate with an electronic device ED. The communication interface unit 14 can be a Bluetooth interface unit, a Zigbee interface unit, a WiFi interface unit, a Wimax interface unit, a NBIoT (Narrowband Internet of Things) interface unit, or a LoRa (Long Range) interface unit. In addition, the electronic device ED can be a tablet PC, a laptop PC, a desk PC, an all-in-one (AIO) PC, a smart phone, a smart TV, a smart bracelet, a smart watch, a smart glasses, or a smart speaker. By such arrangement, as FIG. 8 shows, the switch device 1 of the present invention can be integrated in a wall switch PSW, such that a user is able to control a home appliance (such as a lighting device Bu) to switch On/Off by operating his electronic device ED like a smart phone.

Second Embodiment

Figure 9:
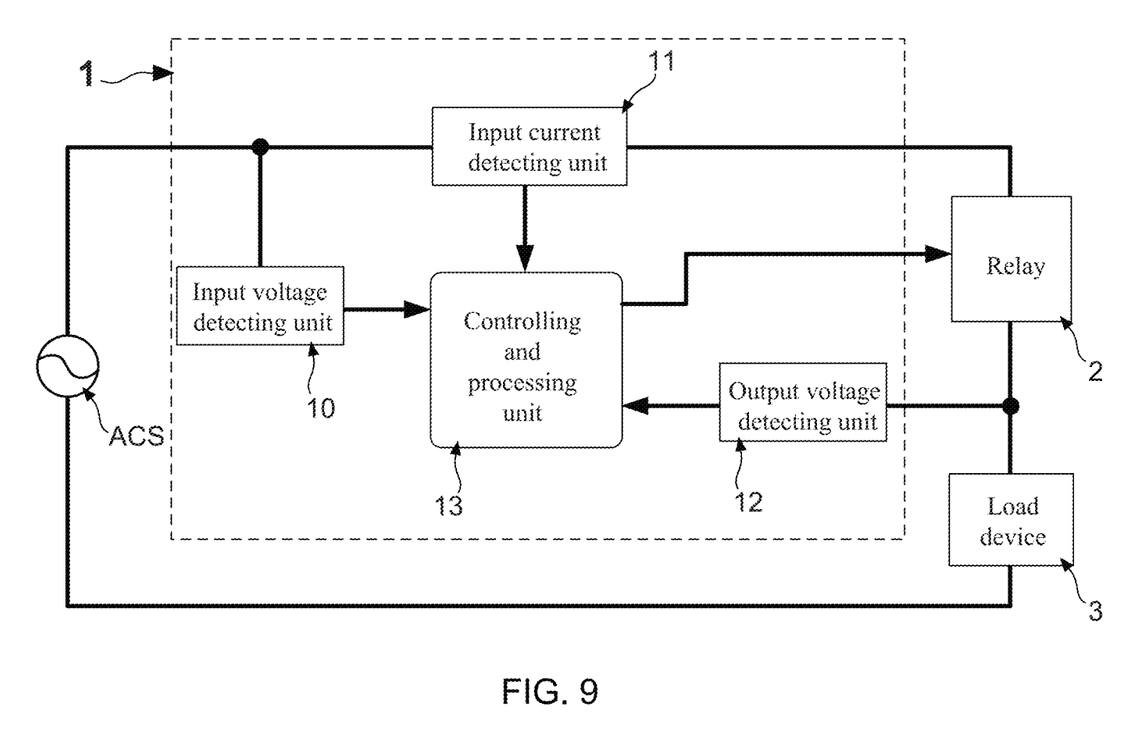
FIG. 9 shows a function block diagram of a second embodiment of the switch device.
Figure 10:
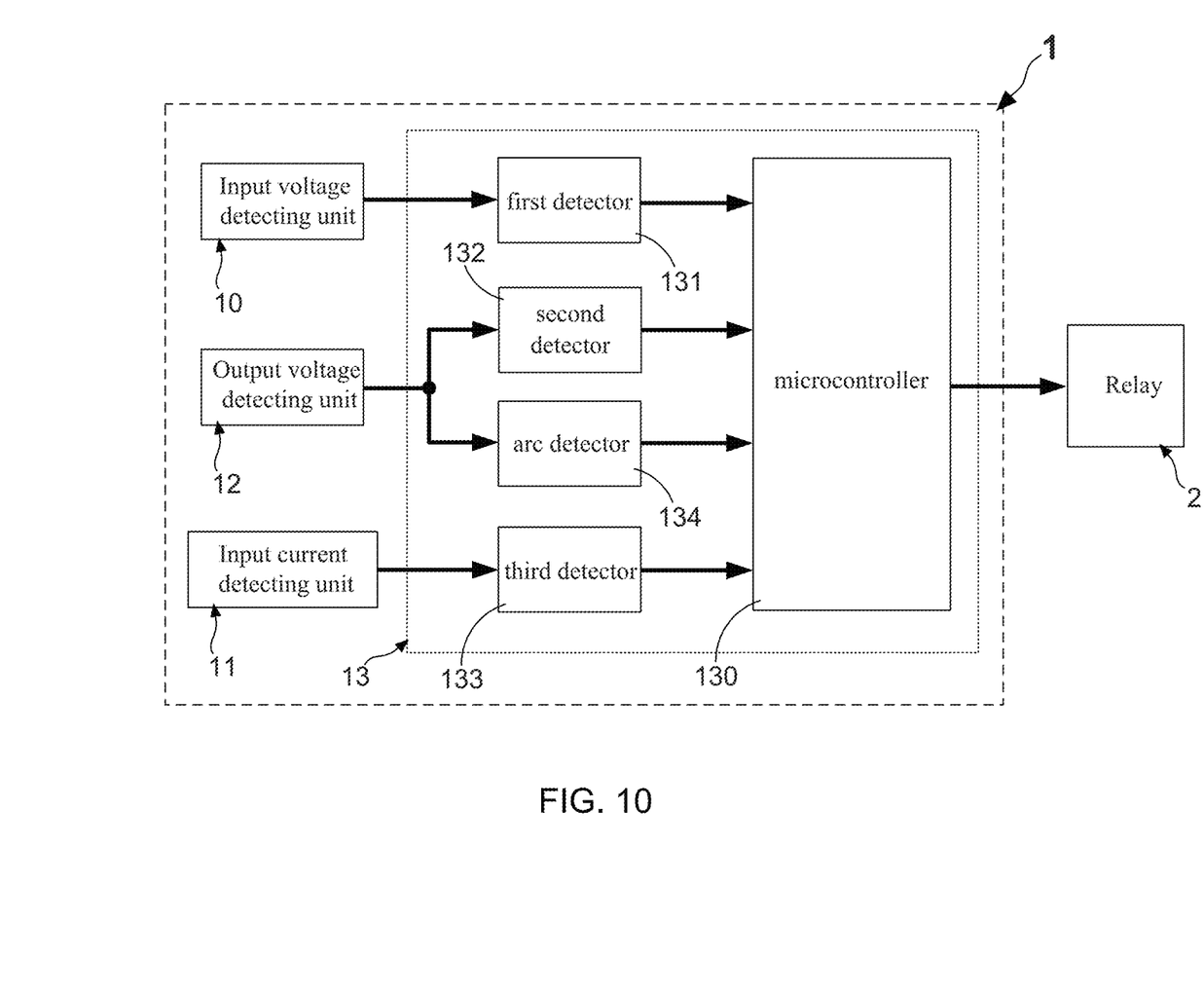
FIG. 10 shows a second function block diagram of the controlling and processing unit.

With reference to FIG. 9, there is provided a function block diagram of a second embodiment of the switch device. Moreover, FIG. 10 shows a second function block diagram of the controlling and processing unit. After comparing FIG. 9 with FIG. 5, it is able to know that the second embodiment of the switch device 1 further comprises an input current detecting unit 11. The input current detecting unit 11 is coupled to the AC power source ACS and electrically connected to the microcontroller 130, and is configured for detecting an input current signal supplied by the AC power source ACS, so as to transmit the detected input current signal to the microcontroller 130. In a specific case, the input current detecting unit 11 is a high-power-type low ohmic resistor, and has a resistance in a range from 0.1 mohm to 970 mohm. However, that does not mean the high-power-type low ohmic resistor is a particularly-limited embodiment of the input current detecting unit 11. Of course, the input current detecting unit 11 can also be a shunt resistor, a Hall effect sensor, or a current transformer (CT) when practically implementing the switch device 1 of the present invention.

From FIG. 10, it is also found the second embodiment of the switch device 1 further comprises a third detector 133, which is coupled to the microcontroller 130, and is configured for detecting a zero crossing point of the input current signal. By such arrangement, the microcontroller 130 generates a relay controlling signal based on the zero crossing point of the input voltage signal, zero crossing point of the input current signal, the zero crossing point of the output voltage signal, the arc-spark-induced signal, and at least one delay time of the relay 2, so as to control the relay 2 execute a short-circuit switch at the zero crossing point of the output voltage signal through the relay controlling signal. Therefore, the load connecting terminal of the relay 2 is electrically connected to at least one load device 3, such that the output voltage signal is transmitted to the load device 3. In addition, the microcontroller 130 also utilizes the relay controlling signal to control the relay 2 to achieve an open-circuit switch at the zero crossing point of the input current signal, so as to stop the output voltage signal from being transmitted to the load device 3.

Third Embodiment

Figure 11:
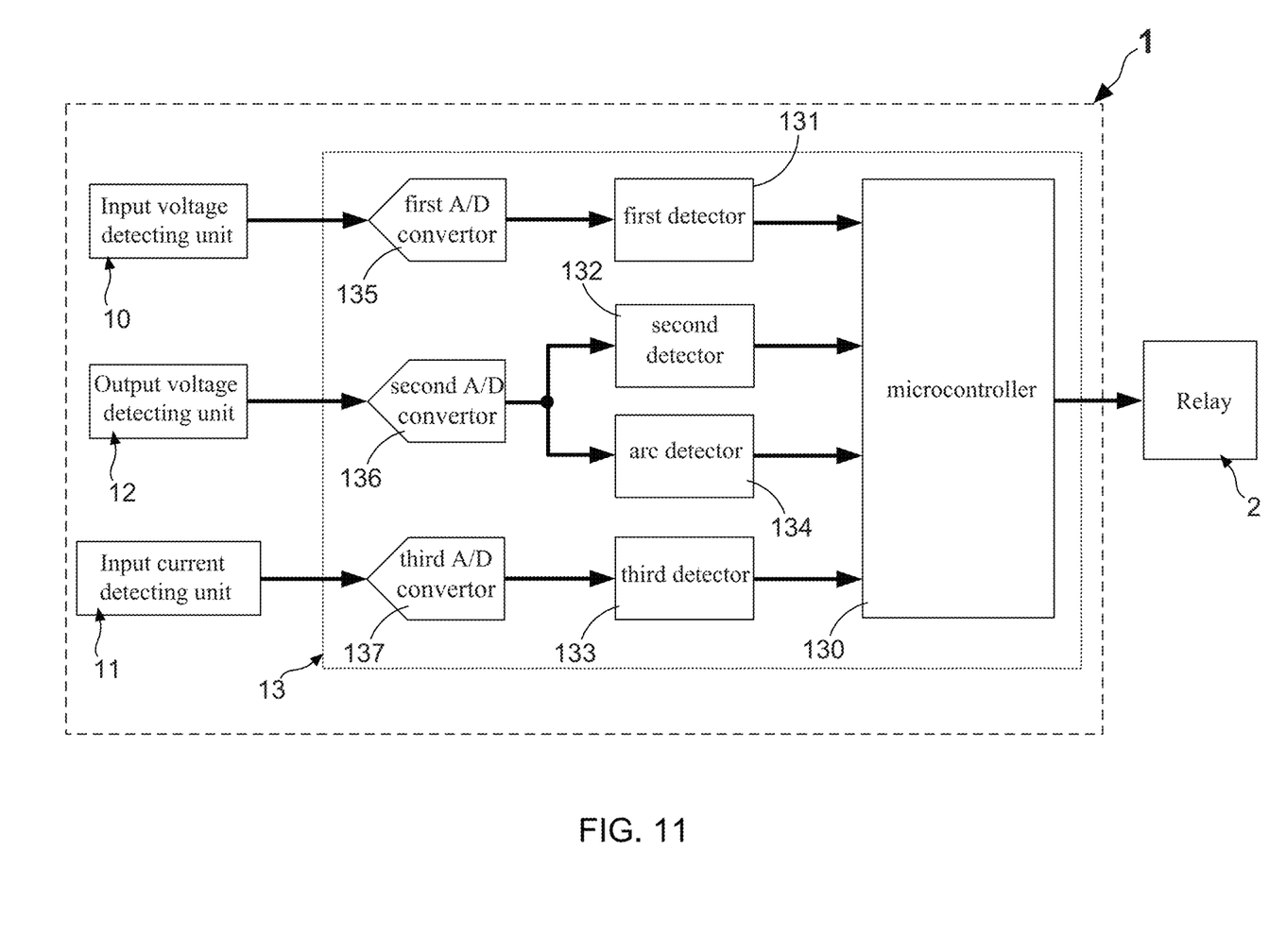
FIG. 11 shows a function block diagram of third second embodiment of the switch device.

With reference to FIG. 11, there is provided a function block diagram of a fourth embodiment of the switch device. After comparing FIG. 11 with FIG. 6, it is understood that the third endowment of the switch device 1 further comprises a first analog-to-digital convertor 135, a second analog-to-digital convertor 136 and a third analog-to-digital convertor 137. The first analog-to-digital convertor 135 is electrically connected between the input voltage detecting unit 10 and the first detector 131, and is configured for converting the input voltage signal to a digital input voltage signal. Moreover, the second analog-to-digital convertor 136 is electrically connected between the output voltage detecting unit 12 and the second detector 132 and is configured for converting the output voltage signal to a digital output voltage signal. On the other hand, the third analog-to-digital convertor 137 is electrically connected between the input current detecting unit 11 and the third detector 133, and is configured for converting the input current signal to a digital input current signal.

By such arrangement, the microcontroller 130 is able to obtain the zero crossing point of the input voltage signal from the digital input voltage signal, to obtain the zero crossing point of the output voltage signal from the digital output voltage signal, and to obtain the zero crossing point of the input current signal from the digital input current signal.

Fourth Embodiment

Figure 12:
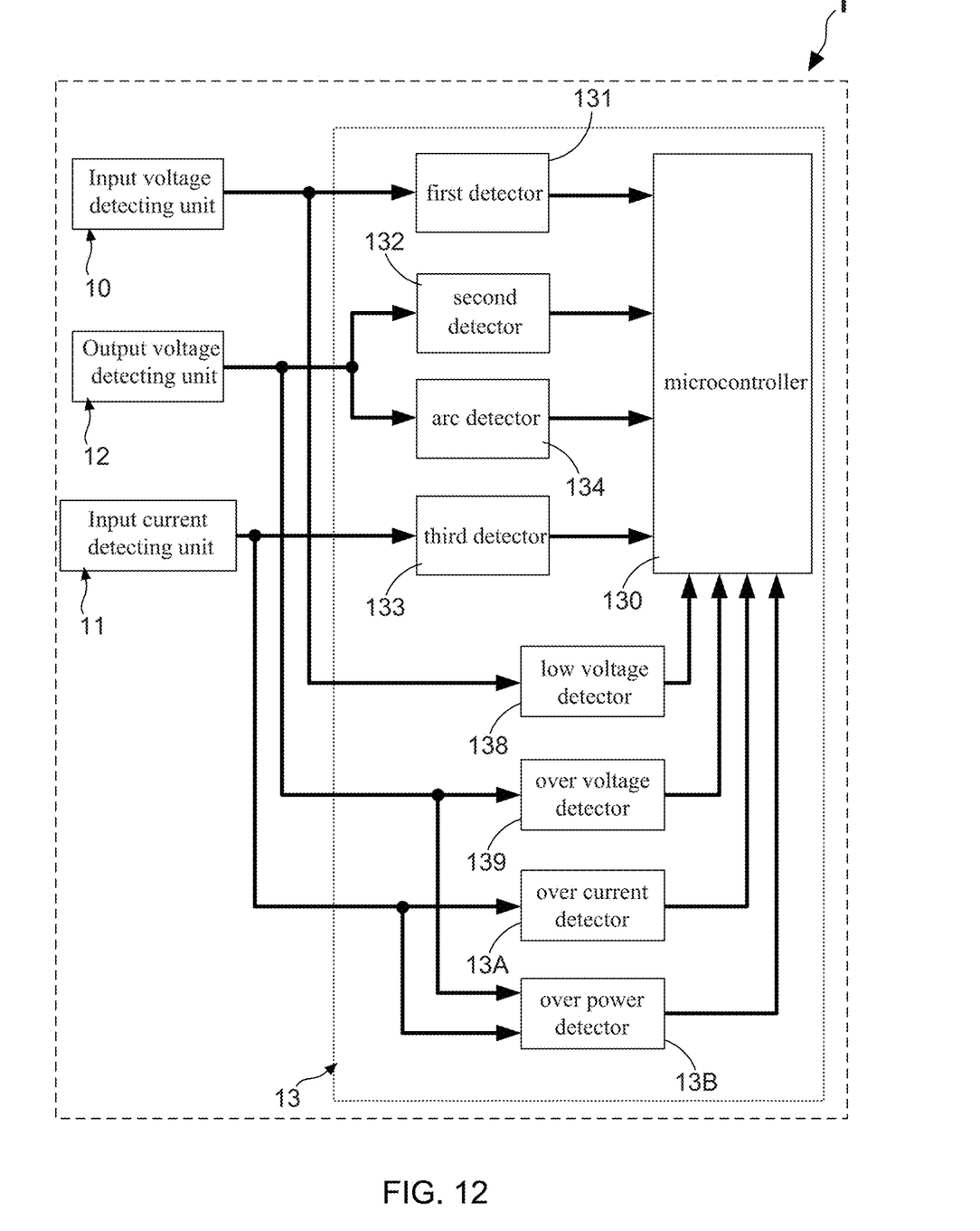
FIG. 12 shows a function block diagram of a fourth embodiment of the switch device.

With reference to FIG. 12, there is provided a function block diagram of a fourth embodiment of the switch device. After comparing FIG. 12 with FIG. 9, it is understood that the fourth endowment of the switch device 1 further comprises a low voltage detector 138, an over voltage detector 139, an over current detector 13A, and an over power detector 13B. The low voltage detector 138 is electrically connected to the input voltage detecting unit 10 for applying a low voltage detecting process to the input voltage signal. The over voltage detector 139 is electrically connected to the output voltage detecting unit 12 for applying an over voltage detecting process to the output voltage signal. The over current detector 13A is electrically connected to the input current detecting unit 11 for applying an over current detecting process to the input current signal. The over power detector 13B is electrically connected to the input current detecting unit 11 and the output voltage detecting unit 12 for applying an over power detecting process to the input current signal and the output voltage signal.

Therefore, through above descriptions, all embodiments and their constituting elements of the switch device capable of automatically detecting and adjusting zero crossing point proposed by the present invention have been introduced completely and clearly; in summary, the present invention includes the advantages of:

(1) The present invention provides a switch device capable of automatically detecting and adjusting zero crossing point, consisting of an input voltage detecting unit 10, an output voltage detecting unit 12 and a controlling and processing unit 13 comprising a first detector 131, a second detector 132, an arc detector 133, and a microcontroller 130. According to zero crossing point of an input voltage signal, zero crossing point of an output voltage signal, relay's delay time, and an arc-spark-induced signal detected by the arc detector 133, the microcontroller 130 is capable of adaptively generating a relay controlling signal to control the relay 2, such that the relay 2 achieves a short-circuit switching at the zero cross point of output voltage signal for making the output voltage signal be transmitted to at least one load device 3. Moreover, the microcontroller 130 is also able to control the relay 2 to finish a short-circuit switching at the zero cross point of input voltage signal, so as to stop the output voltage signal from being transmitted to the load device 3.

The above description is made on embodiments of the present invention. However, the embodiments are not intended to limit scope of the present invention, and all equivalent implementations or alterations within the spirit of the present invention still fall within the scope of the present invention.

What is claimed is:

1. A switch device capable of automatically detecting and adjusting zero crossing point, comprising:
    an input voltage detecting unit, being coupled to an AC power source for detecting an input voltage signal supplied by the AC power source;
    an output voltage detecting unit, being electrically connected to a load connecting terminal of a relay, so as to detect an output voltage signal from the load connecting terminal; wherein an input terminal of the relay is coupled to the AC power source; and
    a controlling and processing unit, being electrically connected to the input voltage detecting unit, the output voltage detecting unit, and the relay, and comprising:
        a first detector, being configured for detecting a zero crossing point of the input voltage signal;
        a second detector, being configured for detecting a zero crossing point of the output voltage signal;
        an arc detector, being configured for detecting an arc-spark-induced signal from the output voltage signal; and
        a microcontroller, being coupled to the first detector, the second detector and the arc detector;
    wherein the microcontroller generates a first relay controlling signal based on the zero crossing point of the input voltage signal, the zero crossing point of the output voltage signal, the arc-spark-induced signal, and at least one delay time of the relay, and utilizing the first relay controlling signal to control the relay to achieve a short-circuit switch at the zero crossing point of the output voltage signal or an open-circuit switch at the zero crossing point of the input voltage signal.

2. The switch device of claim 1, further comprising:
    an input current detecting unit, being coupled to the AC power source and electrically connected to the microcontroller, and being configured for detecting an input current signal supplied by the AC power source, so as to transmit the detected input current signal to the microcontroller.

3. The switch device of claim 2, wherein the controlling and processing unit further comprises:
    a third detector, being coupled to the microcontroller, and being configured for detecting a zero crossing point of the input current signal;

wherein the microcontroller generates a second relay controlling signal based on the zero crossing point of the input voltage signal, the zero crossing point of the output voltage signal, the arc-spark-induced signal, the at least one delay time of the relay, and the zero crossing point of the input current signal, and utilizing the second relay controlling signal to control the relay to achieve the short-circuit switch at the zero crossing point of the output voltage signal or an open-circuit switch at the zero crossing point of the input current signal.

4. The switch device of claim 3, wherein the controlling and processing unit further comprises:
   a first analog-to-digital convertor, being electrically connected between the input voltage detecting unit and the first detector, and being configured for converting the input voltage signal to a digital input voltage signal;
   a second analog-to-digital convertor, being electrically connected between the output voltage detecting unit and the second detector, and being configured for converting the output voltage signal to a digital output voltage signal; and
   a third analog-to-digital convertor, being electrically connected between the input current detecting unit and the third detector, and being configured for converting the input current signal to a digital input current signal.

5. The switch device of claim 4, wherein the controlling and processing unit further comprises:
   a low voltage detector, being electrically connected to the input voltage detecting unit for applying a low voltage detecting process to the input voltage signal;
   an over voltage detector, being electrically connected to the output voltage detecting unit for applying an over voltage detecting process to the output voltage signal;
   an over current detector, being electrically connected to the input current detecting unit for applying an over current detecting process to the input current signal; and
   an over power detector, being electrically connected to the input current detecting unit and the output voltage detecting unit for applying an over power detecting process to the input current signal and the output voltage signal.

6. The switch device of claim 1, further comprising:
   a communication interface unit, being electrically connected to the microcontroller for making the microcontroller communicate with an electronic device.

7. The switch device of claim 6, wherein the electronic device is selected from a group consisting of tablet PC, laptop PC, desk PC, all-in-one (AIO) PC, smart phone, smart TV, smart bracelet, smart watch, smart glasses, and smart speaker.

8. The switch device of claim 1, wherein the load device is a home appliance.

9. The switch device of claim 1, wherein the switch device is integrated in a wall switch.

10. The switch device of claim 1, wherein the input current detecting unit is a high-power-type low ohmic resistor, and having a resistance in a range from 0.1 mohm to 970 mohm.

11. The switch device of claim 1, wherein the input current detecting unit is selected from a group consisting of shunt resistor, Hall effect sensor and current transformer (CT).

12. The switch device of claim 1, wherein both the input voltage detecting unit and the output voltage detecting unit are a resistive voltage divider.

13. The switch device of claim 1, wherein both the input voltage detecting unit and the output voltage detecting unit is selected from a group consisting of Hall effect sensor, potential transformer (PT), and electro-optic voltage transformer.

* * * * *